United States Patent [19]

Bowers

[11] Patent Number: 5,041,795
[45] Date of Patent: Aug. 20, 1991

[54] THREE-TERMINAL OPERATIONAL AMPLIFIER AND APPLICATIONS THEREOF

[75] Inventor: Derek F. Bowers, Sunnyvale, Calif.

[73] Assignee: Analog Devices, Inc., Norwood, Mass.

[21] Appl. No.: 515,558

[22] Filed: Apr. 27, 1990

[51] Int. Cl.$^5$ .............................................. H03F 3/68
[52] U.S. Cl. ...................................... 330/69; 330/84; 330/294; 307/494; 328/127
[58] Field of Search ................... 330/69, 84, 107, 252, 330/294; 307/494; 328/127

[56] References Cited

U.S. PATENT DOCUMENTS 3,573,647  4/1971  Andreas ................................ 330/69

Primary Examiner—James B. Mullins
Attorney, Agent, or Firm—Koppel & Jacobs

[57] ABSTRACT

A three-terminal operational amplifier includes a current input, in addition to the conventional inverting and non-inverting inputs. The current input is inverted and added to the inverting input current, while its voltage is urged to a level equal to that of the inverting and non-inverting inputs. The new amplifier employs a pair of two-terminal operational amplifiers, the first of which has inverting and non-inverting inputs, and the second of which has the current input and a second input connected in common with an input to the first amplifier. Internal feedback circuits provide the desired current conveyance. The circuit may be implemented either with mutually discrete two-terminal operational amplifiers, or these elements may be merged into a single unified circuit. Applications include a general purpose adder/subtractor circuit, an inverting gain amplifier, an instrumentation amplifier, integrators and differentiators.

31 Claims, 5 Drawing Sheets

THREE-TERMINAL OPERATIONAL AMPLIFIER AND APPLICATIONS THEREOF

BACKGROUND OF THE INVENTION

1. Field of the Invention

This invention relates to operational amplifier circuits, and to more complex circuits employing operational amplifiers.

2. Description of the Related Art

Operational amplifiers (op amps) have become a universal building block for analog systems. The principal reason for this is the ease with which their overall characteristics can be accurately defined using simple feedback components. It is used as the basic element in the performance of various mathematical operations such as addition, subtraction, multiplication, integration, differentiation and logarithms.

A basic schematic diagram of a conventional op amp is given in FIG. 1. A pair of transistors Q1,Q2 are differentially connected, dividing the current from a current source I1 which in turn is supplied from a positive voltage bus V+. The inverting input is provided at the base of Q1, and the non-inverting input at the base of Q2.

Equal currents are drawn through the collector-emitter circuits of Q1 and Q2 by a diode-connected transistor Q3 that is connected to Q1, and another transistor Q4 which mirrors the current through Q3 and is connected to Q2. The emitters of transistors Q3 and Q4 are connected to a negative voltage bus V− through respective equal value transistors R1,R2.

An output is taken from the collector of Q4 to the base of a second gain stage transistor Q5, which in turn feeds an output stage 2. An output terminal 4 is taken from the output stage, and supplies an output voltage $V_o$.

A current source transistor Q6 supplies current to the differentially connected input transistors Q1,Q2. Since the two input branches are balanced and carry equal currents, the inverting input voltage tracks the non-inverting input voltage. Various input formats can be applied to the op amp in conjunction with a feedback circuit between the output terminal 4 and the inverting input to perform the various op amp functions, in a well-known manner.

When feedback is applied, however, the apparent symmetry between the inverting and non-inverting inputs is destroyed, resulting in a high impedance at the non-inverting input and a low impedance at the inverting input. The result is that applications centered about shunt feedback must be inverting only, and applications centered about series feedback must be non-inverting only. Because of this limitation truly differential circuits, such as instrumentation amplifiers, are usually constructed from multiple op amps and additional external components. With such an approach, however, it is difficult to maintain true symmetry without a requirement for matched amplifiers, extensive trimming and complicated frequency compensation techniques. Furthermore, the circuitry required to implement some of the op amp applications is complex, and it would be desirable to have a way of simplying it.

SUMMARY OF THE INVENTION

In view of the above problems, the present invention seeks to provide an operational amplifier function that attains a significantly higher degree of symmetry than conventional op amps, and yet avoids the complications associated with prior symmetrical circuits. An object is to provide a new type of op amp that can perform all of the functions of a conventional op amp, and yet has the flexibility to accommodate additional functions that would normally require relatively complex circuit modifications.

The present invention consists of a three-terminal op amp, in which a current input is provided in addition to the usual inverting and non-inverting inputs. The new op amp in effect inverts the current from the current input and adds it to the inverting input current, with either unity or non-unity gain as desired. The new amplifier circuitry urges the voltage of the current input to a common voltage level with the inverting and non-inverting inputs.

The three-terminal op amp is implemented with a pair of two-terminal op amps. The first op amp has conventional inverting and non-inverting inputs, while the second op amp has a current input and a second input which is connected in common with one of the inputs to the first op amp. A first feedback circuit is connected between the output of one of the op amps and the inverting input of the first op amp, while a second feedback circuit is connected between the output of said one op amp and the current input to the second op amp; the circuit output is taken from the output of the op amp that is not connected to the internal feedback circuits.

While the two op amps can be mutually discrete, they are preferably merged together so that the second input of the second op amp and its common input with the first op amp share a common input terminal and common circuitry within the overall amplifier. The internal feedback circuits may consist of resistors, but to reduce limitations on the current available from the amplifier the feedback circuits may also be implemented as non-linear circuits.

The invention also includes various applications for the new three-terminal op amp, including its use in a summing amplifier, voltage amplifier, instrumentation amplifier, integrator and differentiator.

These and other features and advantages of the invention will be apparent to those skilled in the art from the following detailed description of preferred embodiments, taken together with the accompanying drawings, in which:

DETAILED DESCRIPTION OF THE INVENTION

Figure 1:
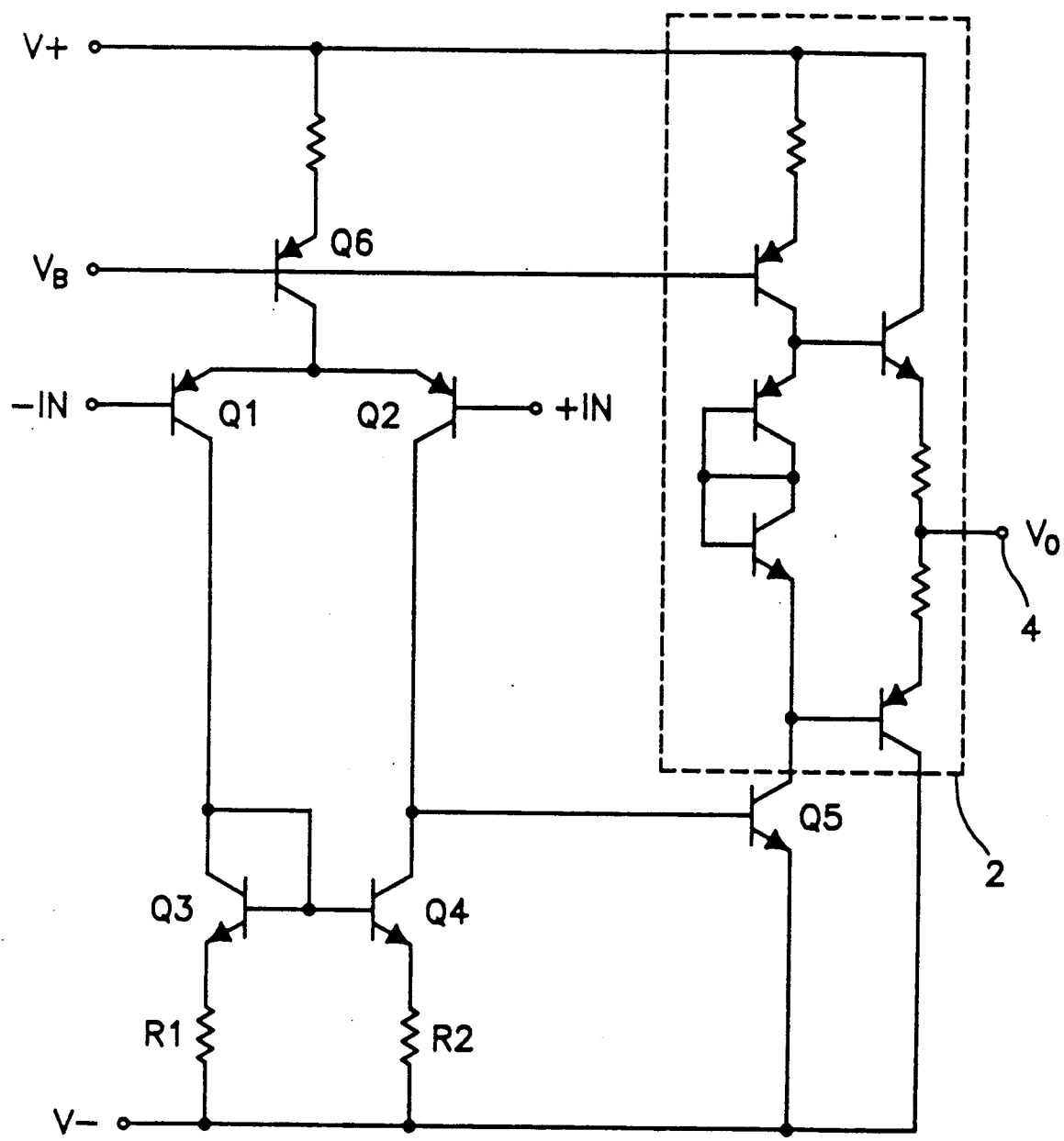
FIG. 1 is a schematic drawing of a conventional op amp circuit.
Figure 2:
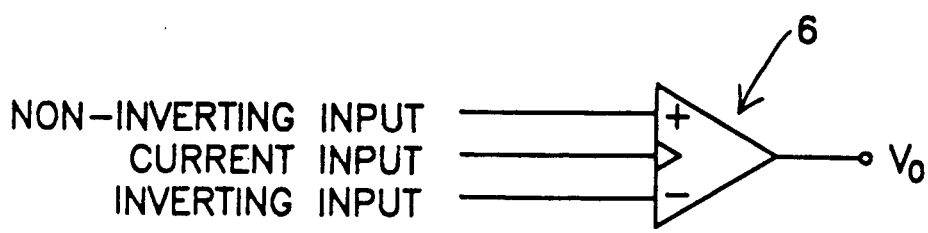
FIG. 2 shows the circuit symbol adopted for the present three-terminal op amp.

A symbol 6 for the new three-terminal op amp is given in FIG. 2. The device has the usual inverting and non-inverting inputs, and in addition can accommodate a current signal input. If the current input is ignored, the amplifier functions identically to a conventional two-terminal op amp, and feedback can be applied from the output to the inverting input in the usual fashion. The addition of the current input opens up new capabilities for the device, and simplifies the circuit implementation for the realization of a number of existing two-terminal op amp functions. Its basic operation is to invert the current in the current input, add the inverted current to the inverting input, and hold the voltage at the current input to the voltage level of the other two inputs. Depending upon the particular circuit implementation, the current inversion can occur with either a unity or a non-unity gain.

Figure 3:
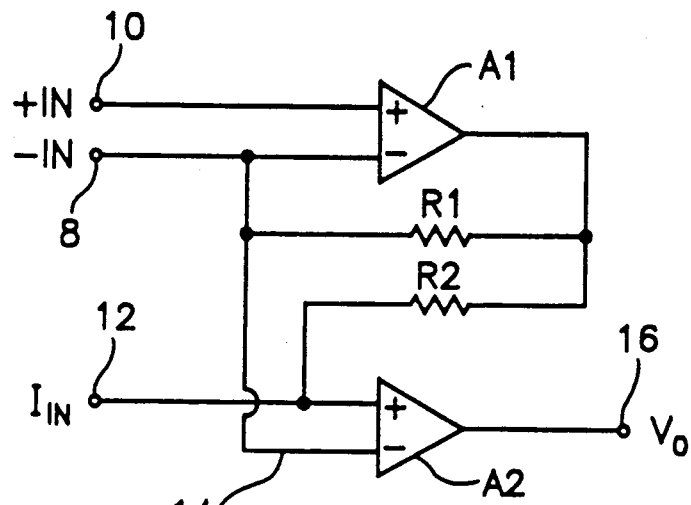
FIG. 3 is a block diagram illustrating a preferred implementation of the new op amp.

FIG. 3 is a functional block diagram showing one implementation of the new three-terminal op amp. The circuit may be envisioned as a combination of a pair of conventional two-terminal op amps A1 and A2. A1 has conventional inverting and non-inverting input terminals 8,10, while A2 has a current signal input terminal 12 connected to what would otherwise be its non-inverting input, and its inverting input 14 connected in common with the inverting input to A1. A first feedback resistor R1 is connected between the output of A1 and its inverting input, while a second feedback resistor R2 is connected between the output of A1 and the non-inverting input of A2. The output terminal 16 for the overall circuit is taken from the output of A2.

The current at the current input 12 is conveyed via R2 to the output of A1. It relieves the current flowing through R1 from the inverting input 8 of A1, and thus in effect is inverted and added to the inverting input current. If the resistance values of R1 and R2 are equal, the magnitude of current subtracted from the inverting input will equal the current at the current input 12. If R1 and R2 are not equal, the magnitude of current subtracted from the inverting input will have a non-unity gain with respect to the current input signal.

Op amp A1 urges the voltage at its inverting input towards a value equal to the voltage at its non-inverting input, in the usual fashion. Since the inverting input of A2 is connected to the inverting input of A1, it also follows the voltage at the non-inverting input of A1. Through the normal op amp action of A2, the voltage at the current input terminal 12 will thus also track the inverting and non-inverting input voltage levels of A1.

The circuit configuration of FIG. 3 may be varied within the scope of the invention, and specific examples of such variations are given below. The common characteristics of such variations, however, are as follows:

1) There are a pair of two-input op amps, either discrete or merged together.
2) The first op amp has inverting and non-inverting inputs, while the second op amp has a current input and a second input that is connected in common with one of the inputs to the first op amp.
3) A first feedback circuit is connected between the output of one of the op amps and the inverting input of the first op amp.
4) A second feedback circuit is connected between the output of that one op amp and the current input to the second op amp.
5) The three-terminal op amp output is taken from the output of the two-terminal op amp to which the internal feedback circuits are not connected.

In use, an external feedback circuit is normally connected between the output of the three-terminal op amp and its inverting input. This yields a relatively low input impedance for the inverting input as well as the current input, to which one of the internal feedback circuits is connected, and a high input impedance at the non-inverting input terminal.

Figure 4:
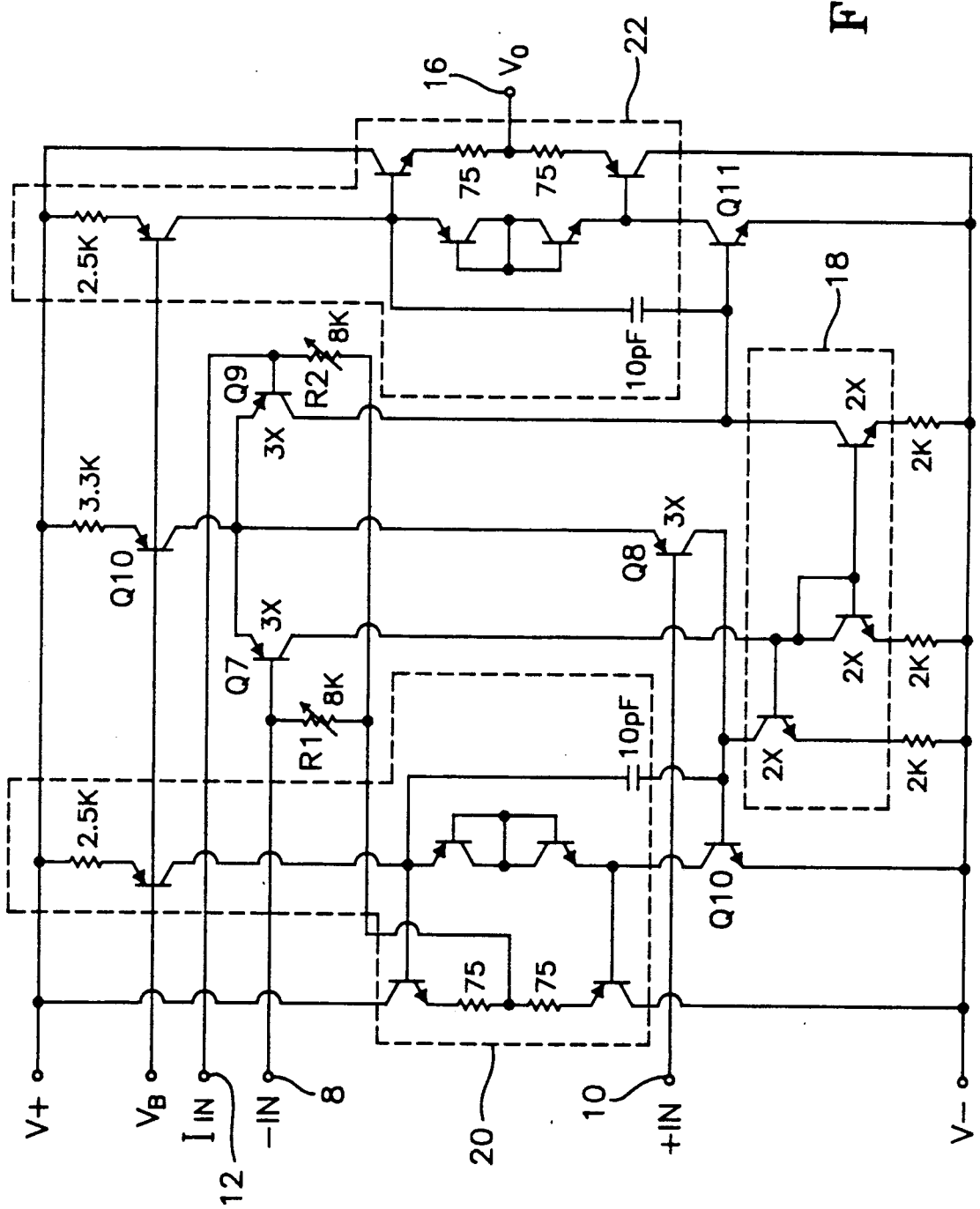
FIG. 4 is a schematic diagram of circuitry used to implement the block diagram of FIG. 3.

The implementation shown in FIG. 3 can be simplified by merging together sections of the two-terminal op amps. FIG. 4 is a more detailed schematic diagram which shows a possible way to achieve this. This design in effect provides a single common input stage for the inverting inputs of A1 and A2 shown in FIG. 3, since these inputs are connected in common anyway.

The FIG. 4 circuit uses three input transistors Q7, Q8 and Q9 respectively for the common inverting inputs of A1 and A2, the non-inverting input of A1, and the current input of A2. The relative transistor scalings are indicated by the "x" factors given in the circuit diagram. The three transistors Q7,Q8,Q9 are differentially connected and supplied with current by a common current source transistor Q10; Q10 is biased by a bias voltage $V_B$, and connected to a positive voltage bus $V+$.

Approximately equal currents are drawn through the three input transistors Q7,Q8,Q9 by a three-transistor current mirror circuit 18. It can be seen that the single input transistor Q7 performs the common input functions of the inverting inputs to both A1 and A2, which are connected together in FIG. 3.

A transistor Q10 has its base connected to the collector of non-inverting input transistor Q8, and functions as the second gain stage for two-terminal op amp A1 shown in FIG. 3. The output stage for A1 is enclosed in dashed line 20. Another transistor Q11 has its base connected to the collector of Q9, and functions as the second gain stage for two-terminal op amp A2. The output stage for A2 is enclosed in dashed line 22. The connections for internal feedback resistors R1 and R2, between the output of output stage 20 and the bases of Q7 and Q9, respectively, are also shown in FIG. 4.

Figure 5:
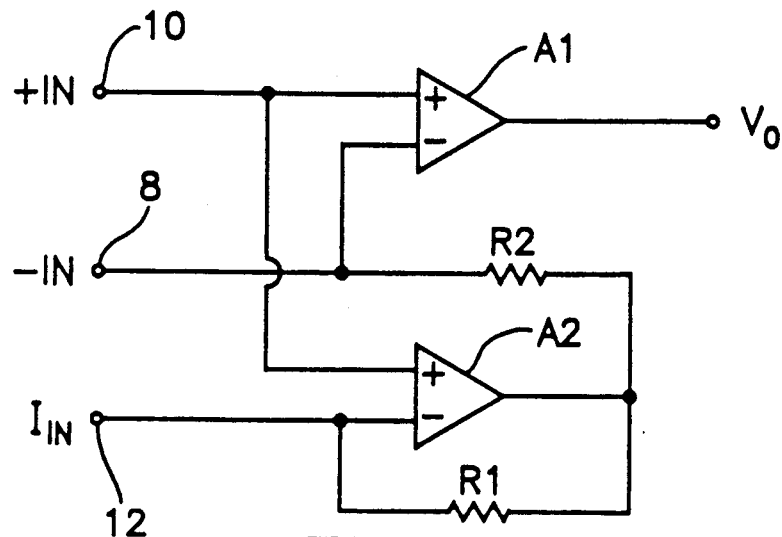
FIG. 5 is a block diagram of a modified implementation of the new op amp.

A variation of the implementation circuit for the new three-terminal op amp is shown in FIG. 5. This implementation is illustrated as a pair of discrete two-terminal op amps in a manner analogous to FIG. 3, although the two-terminal op amps could also be merged together in a manner similar to the approach of FIG. 4.

In the embodiment of FIG. 5 the non-inverting inputs of A1 and A2 are tied together in common, rather than the inverting inputs as in FIG. 3. The current input terminal 12 is connected to the inverting input of A2. The internal feedback resistors R1 and R2 are connected to the output of A2, rather than the output of A1 as in FIG. 3. R1 is connected between the output of A2 and the current input, while R2 is connected between the output of A2 and the inverting input.

As a variation on the circuit of FIG. 5, the non-inverting input of A2 could be connected to inverting input terminal 8, rather than non-inverting input terminal 10. While this variation would in principal work the same as the circuit of FIG. 5, the likelihood of encountering oscillation instability problems would be greater.

One disadvantage of the implementations discussed thus far is that all of the output current from A1 in FIG. 3 and from A2 in FIG. 5 has to flow through the feedback resistors R1 and R2. This imposes a supply-dependent limitation upon the current available from the current input section, and some caution must be exercised in using the device to avoid exceeding this limit. While this limitation could be rectified by simply making the feedback resistors small, such an approach is not generally practical because it has the effect of amplifying errors in the amplifier from which the feedback resistors are taken.

Figure 6:
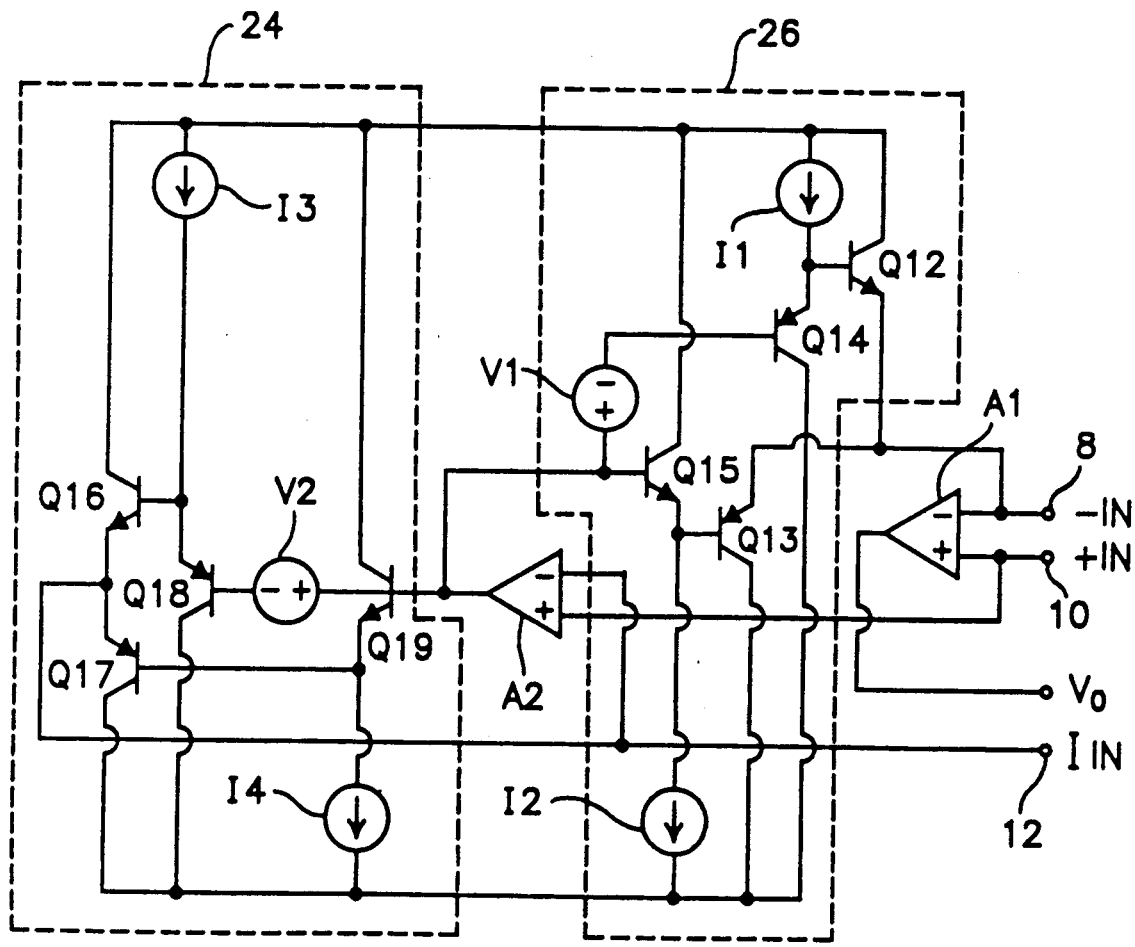
FIG. 6 is a schematic diagram showing a modification to the circuit of FIG. 5 in which feedback resistors are replaced by nonlinear feedback circuits.

A way to remove this limitation is to replace the feedback resistors R1,R2 with nonlinear elements, such as diodes or transistors; this effectively results in class AB operation. Such operation will result in some nonlinearity if the nonlinear elements are not perfectly matched, but this would probably be quite small with a monolithic device. FIG. 6 shown a possible modification of the FIG. 5 circuit to achieve this type of operation.

In FIG. 6, nonlinear circuit 24 is connected in place of R1 between the output of A2 and the current input terminal 12, while nonlinear circuit 26 is connected in place of R2 between the output of A2 and the inverting input 8. Transistors Q12,Q13,Q14,Q15 in the nonlinear circuit 26 form an open-loop buffer with approximately unity gain, and an adaptive output impedance which reduces with load current. This buffer supplies the current to the inverting input of the three-terminal op amp. The limit for this current is now equal to the equal current through current sources I1 and I2, multiplied by the gain of the output transistors. A voltage source V1 reduces the buffer idling current, ensuring a high output impedance at low current terminal currents.

Nonlinear circuit 24 is ideally identical to circuit 26. Transistors Q16,Q17,Q18,Q19 form an identical buffer in the feedback path of A2, cancelling out the nonlinearities of the first buffer in circuit 26. In a simulation of the FIG. 6 circuit, a value of 100 microamps was chosen for the current sources, and 120 mV for V1 and V2.

Figure 7:
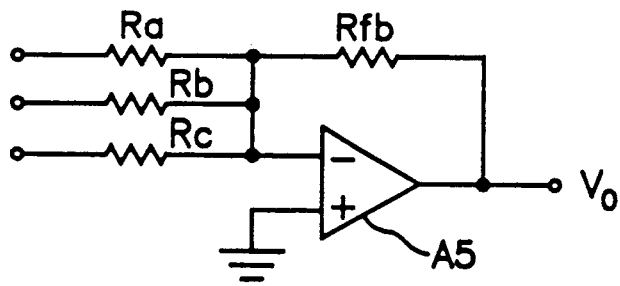
FIG. 7 is a schematic diagram of a conventional summing amplifier.

Several applications of the new three-terminal op amp will now be discussed. The first is a summing amplifier. A conventional summing amplifier is shown in FIG. 7, with a feedback resistor Rfb connected between the output and inverting input of a conventional two-terminal op amp A3, and a set of inputs to be added together connected to the inverting op amp input through respective resistors Ra, Rb and Rc. This circuit provides summation and scaling of multiple signals without an interaction between the signals. It is a shunt feedback system, and consequently provides an inverted transfer function. The non-inverting input is grounded, holding the inverting input at a virtual ground.

Figure 8:
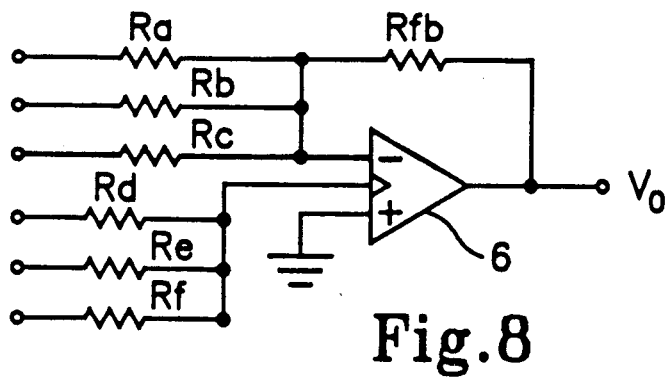
FIG. 8 is a schematic diagram of a summing amplifier employing the new three-terminal op amp.

The substitution of a three-terminal op amp of the present invention for the summing amplifier is illustrated in FIG. 8. The feedback and summing input connections to the inverting input are the same as in the conventional circuit of FIG. 7, and the non-inverting input is again grounded. If no connection were made to the current input, the circuit would function in the same manner as that of FIG. 7. Additional summing inputs are connected to the current input through respective resistors Rd,Re,Rf. The additional virtual ground at the current input adds a non-inverting transfer function to the amplifier output. Accordingly, the circuit may be employed as a general purpose adder/subtractor, designated generically as a "summing" function, with signals supplied to the inverting inputs subtracted and signals supplied to the current input added in the amplifier output. The three-terminal op amp can be used in a similar fashion to perform current-to-voltage conversion from devices with complementary current outputs, as in some analog multipliers and many digital-to-analog converters.

Figure 9:
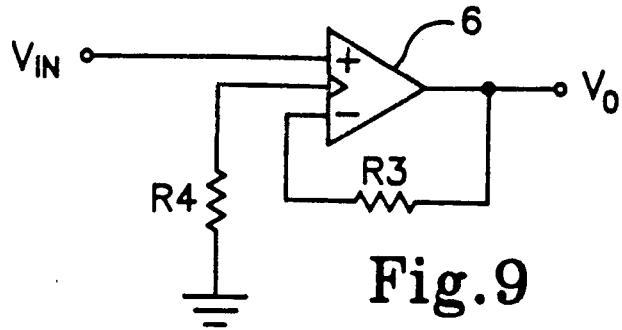
FIG. 9 is a schematic diagram of a voltage amplifier employing the new three-terminal op amp.

An amplifier configuration capable of providing an inverting amplification of the voltage signal at the non-inverting input is shown in FIG. 9. It employs the three-terminal op amp equivalent of a series feedback connection for a two-terminal device. A feedback resistor R3 is connected between the output of the three-terminal op amp 6 and its inverting input. A second resistor R4 is connected between the current input of op amp 6 and a voltage reference, typically ground. The overall transfer function is:

$$V_o = Vin(1 - R3/R4).$$

Figure 10:
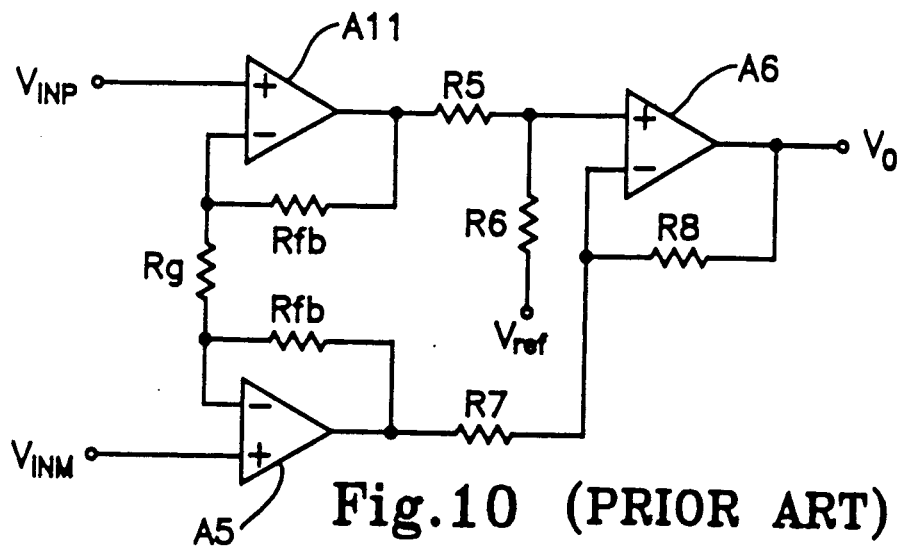
FIG. 10 is a schematic diagram of a conventional instrumentation amplifier.

The invention is also applicable to instrumentation amplifiers. These are devices designed to amplify the difference between two inputs with a defined gain, and to produce a single-ended output referenced to a known reference point, usually ground. Implementing an instrumentation amplifier in a general purpose fashion is somewhat complex using conventional op amps. A classic three op amp implementation is shown in FIG. 10. A pair of input two-terminal op amps A4 and A5 receive input signals $V_{inp}$ and $V_{inm}$ at their respective non-inverting inputs, while their inverting inputs are tied together through a gain resistor Rg. Each op amp A4,A5 has a respective feedback resistor Rfb connected between its output and inverting input. The outputs of A4 and A5 are connected through respective resistors R5 and R7 to the non-inverting and inverting inputs of a third two-terminal op amp A6, respectively, with another resistor R6 tapped off the non-inverting input of A6 to a voltage reference. The circuit output is taken from the output of A6, which includes a feedback resistor R8 to its inverting input.

Assuming R5, R6, R7 and R8 are equal, the overall transfer function for the circuit of FIG. 10 is:

$$V_o - Vref = (V_{inp} - V_{inm})(2Rfb/Rg + 1)$$

This transfer function is somewhat awkward from a resistor value viewpoint, and additionally can never have a gain of less than unity. Two other significant drawbacks of the circuit are that the common mode input range reduces in the presence of a differential signal, and R5–R8 all have to match extremely well for good common mode rejection; any trimming performed on these resistors interacts with the gain equation.

Figure 11:
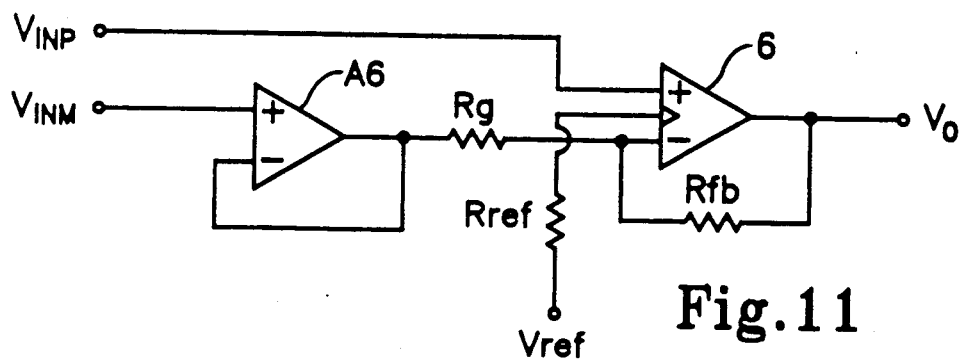
FIGS. 11, 12 and 13 are schematic diagrams respectively showing an instrumentation amplifier, an integrator circuit and a differentiator circuit employing the new three-terminal op amp.

The three-terminal op amp implementation of an instrumentation amplifier is shown in FIG. 11, and substantially removes all of these disadvantages. The circuit includes a three-terminal op amp 6 of the type disclosed herein, with a feedback resistor Rfb between its output and inverting input. Its current input is connected to Vref through a reference resistor Rref, which preferably equals Rfb to avoid degradation of the common mode rejection ratio (CMRR). $V_{inp}$ is connected directly to the non-inverting input of three-terminal op amp 6, while $V_{inm}$ is connected to the non-inverting input of a two-terminal op amp A6. The output of A6 is tied back to its inverting input, and is connected to the inverting input of three-terminal op amp 6 through the gain resistor Rg. The transfer function of the circuit is:

$$V_o - V_{ref} = (V_{inp} - V_{inm})(Rfb/Rg)$$

This function is independent of Rref, which can be used to trim the common mode rejection ratio. The buffer amplifier A6 could also be implemented as another three-terminal op amp for purposes of symmetry if desired.

Figure 12:
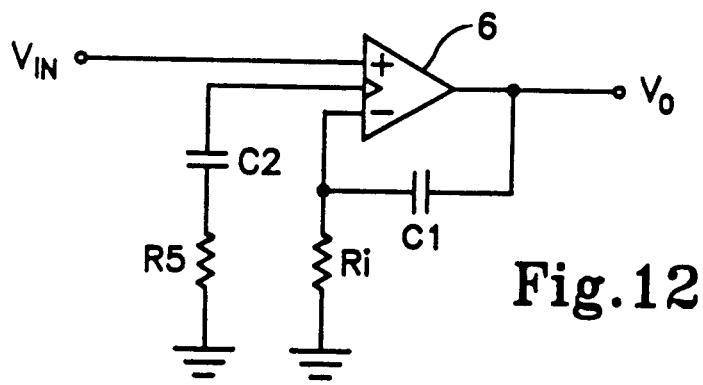

The application of the invention to an integrator is shown in FIG. 12. A feedback capacitor C1 is connected between the output of a three-input op amp 6 and its inverting input, with an integrating resistor Ri connected between the inverting input and a voltage reference, typically ground. Another capacitor C2 is connected between the current input to the op amp and ground through a small stabilizing resistor R5, while the input voltage signal is applied to the non-inverting op amp input. Assuming that C1 and C2 are equal, the transfer function for the circuit is:

$$V_o = 1/RiC \int V_{in}\, dt.$$

The circuit will still function if C1 and C2 have different values, but an additional term will be introduced into the transfer function and considerably complicate it.

Figure 13:
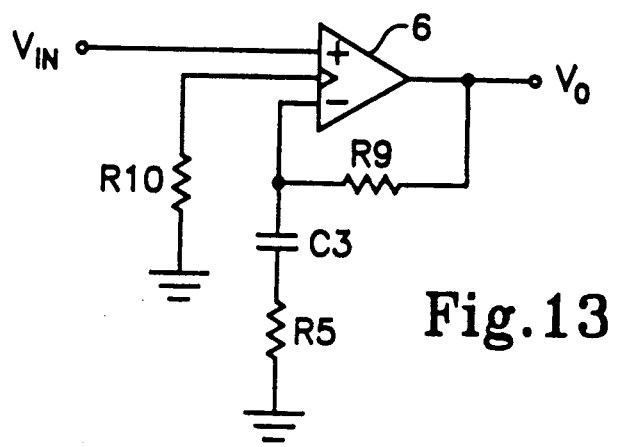

A differentiator circuit is illustrated in FIG. 13. A feedback resistor R9 is connected between the output and inverting input of the three-terminal op amp 6, with a capacitor C3 and small stabilizing resistor R5 connected in series between the inverting input and a voltage reference such as ground. Another resistor R10 is connected between the op amp current input and ground, with the input voltage signal connected to the non-inverting input. Assuming R9 is equal to R10, the transfer function for this circuit is:

$$V_o = RC3 \frac{dV_{in}}{dt}$$

A more complicated transfer function with an additional term will result if R9 is not equal to R10.

The invention can thus be seen to provide a new type of op amp that has greater symmetry and application flexibility than conventional two-terminal op amps. While several different embodiments of the basic three-terminal op amp have been shown and described, as well as several applications for the device, numerous variations and alternate embodiments will occur to those skilled in the art. Accordingly, it is intended that the invention be limited only in terms of the appended claims.

I claim:

1. In an operational amplifier having inverting and non-inverting input terminals for receiving respective externally supplied input signals, an output terminal for providing an amplified output, and a circuit urging said inverting and non-inverting inputs towards a common voltage level, the improvement comprising:
   a third input terminal for receiving an externally supplied input current signal to said operational amplifier, and
   circuit means for adding a second current which matches said input current signal and is inverted with respect thereto to a current supplied from said inverting input terminal, and for urging said third input terminal toward a common voltage level with said inverting and non-inverting input terminals.

2. The operational amplifier of claim 1, said operational amplifier being configured to present low input impedances to said inverting and third terminals, and a high input impedance to said non-inverting terminal.

3. The operational amplifier of claim 1, said circuit means providing said second current with a substantially unity gain with respect to said input current signal.

4. A three-terminal operational amplifier, comprising:
   a first operational amplifier having inverting and non-inverting inputs for receiving externally supplied input signals, and an output for supplying an amplified output,
   a second operational amplifier having a current input for receiving an externally supplied input current signal, a second input connected in common with one of the inputs to said first operational amplifier, and an output that is passively decoupled from the non-inverting input for said first operational amplifier,
   a first resistive feedback circuit connected between the output of one of said operational amplifiers and the inverting input of said first operational amplifier,
   a second resistive feedback circuit connected between the output of said one operational amplifier and the current input to said second operational amplifier, and
   an output terminal at the output of the operational amplifier which is not connected to said feedback circuits.

5. The three-terminal operational amplifier of claim 4, in which said feedback circuits are configured to subtract from said inverting input a current which is matched with the input current to said current input.

6. The three-terminal operational amplifier of claim 5, in which said feedback circuits are configured to subtract from said inverting input a current which has a substantially unity gain with respect to the input current to said current input.

7. The three-terminal operational amplifier of claim 4, wherein said first and second operational amplifiers are mutually discrete.

8. The three-terminal operational amplifier of claim 4, wherein said current input is connected to a non-inverting input of said second operational amplifier, the first operational amplifier's inverting input is connected in common with an inverting input of said second operational amplifier, said first feedback circuit is connected between the output of said first operational amplifier and its inverting input, and said second feedback circuit is connected between the output of said first operational amplifier and the current input to said second operational amplifier.

9. The three-terminal operational amplifier of claim 4, said first and second feedback circuits comprising respective resistor circuits.

10. A three-terminal operational amplifier, comprising:
   a first operational amplifier having inverting and non-inverting inputs, and an output, a second operational amplifier having a current input, a second input connected in common with one of the inputs to said first operational amplifier, and an output, a first feedback circuit connected between the output of one of said operational amplifiers and the inverting input of said first operational amplifier, a second feedback circuit connected between the output of said one operational amplifier and the current input to said second operational amplifier, and an output terminal at the output of the operational amplifier which is not connected to said feedback circuits, said current input being connected to an inverting input of said second operational amplifier, the first operational amplifier's non-inverting input being connected in common with a non-inverting input of said second operational amplifier, said first feedback circuit being connected between the output of said second operational amplifier and the inverting input of said first operational amplifier, and said second feedback circuit being connected between the output of said second operational amplifier and its current input.

11. A three-terminal operational amplifier, comprising:

a first operational amplifier having inverting and non-inverting inputs, and an output, a second operational amplifier having a current input, a second input connected in common with one of the inputs to said first operational amplifier, and an output, a first nonlinear feedback circuit connected between the output of one of said operational amplifiers and the inverting input of said first operational amplifier, a second nonlinear feedback circuit connected between the output of said one operational amplifier and the current input to said second operational amplifier, and an output terminal at the output of the operational amplifier which is not connected to said feedback circuits.

12. A summing amplifier, comprising:
a) a three-terminal operational amplifier, comprising:
1) an inverting input terminal,
2) a non-inverting input terminal,
3) an output terminal,
4) a circuit urging said inverting and non-inverting terminals toward a common voltage level,
5) a current input terminal for supplying a current input, and
6) circuit means for adding a current which matches said current input and is inverted with respect thereto to the input current supplied by said inverting input terminal, and for urging said current input terminal toward a common voltage level with said inverting and non-inverting input terminals,
b) a feedback resistor connected between said output terminal and said inverting input terminal,
c) a plurality of summing inputs connected across respective summing input resistors to said inverting input terminal to produce an inverted summed signal at said output terminal, and
d) at least one additional summing input connected across respective additional summing input resistors to said current input terminal to produce a non-inverted summed signal which accumulates with said inverted summed signal at said output terminal.

13. A summing amplifier, comprising:
a) a three-terminal operational amplifier, comprising:
1) a first operational amplifier having inverting and non-inverting inputs and an output,
2) a second operational amplifier having a current input, a second input connected in common with one of the inputs to said first operational amplifier, and an output,
3) a first feedback circuit connected between the output of one of said operational amplifiers and the inverting input of said first operational amplifier,
4) a second feedback circuit connected between the output of said one operational amplifier and the current input to said second operational amplifier, and
5) an output terminal at the output of the operational amplifier which is not connected to said feedback circuits,
b) a feedback resistor connected between said output terminal and said inverting input,
c) a plurality of summing inputs connected across respective summing input resistors to said inverting input to produce inverted summed signal at said output terminal, and
d) at least one additional summing input connected across respective additional summing input resistors to said current input to produce a non-inverted summed signal which accumulates with said inverted summed signal at said output terminal.

14. An inverting gain amplifier, comprising:
a) a three-terminal operational amplifier, comprising:
1) an inverting input terminal for receiving an externally supplied input signal,
2) a non-inverting input terminal for receiving an externally supplied input signal,
3) an output terminal for providing an amplified output,
4) a circuit urging said inverting and non-inverting input terminals toward a common voltage level,
5) a current input terminal for providing an externally supplied current input, and
6) circuit means for adding a current which matches said current input and is inverted with respect thereto to the input current supplied by said inverting input terminal, and for urging said current input terminal toward a common voltage level with said inverting and non-inverting input terminals,
b) a first resistor connected between said output terminal and said inverting input terminal, and
c) a second resistor connected between said current input terminal and a voltage reference,
said inverting gain amplifier inverting and amplifying an input voltage signal at said non-inverting input terminal in accordance with the relative resistance values of said first and second resistors.

15. An inverting gain amplifier, comprising:
a) a three-terminal operational amplifier, comprising:
1) a first operational amplifier having inverting and non-inverting inputs for receiving respective externally supplied input signals, and an output for providing an amplified output, 2) a second operational amplifier having a current input for receiving an externally supplied input current, a second input connected in common with one of the inputs to said first operational amplifier, and an output that is passively decoupled from said non-inverting input, said second operational amplifier being connected to urge said current input towards a common voltage level with said inverting and non-inverting inputs, 3) a first resistive feedback circuit connected between the output of one of said operational amplifiers and the inverting input of said first operational amplifier, 4) a second resistive feedback circuit connected between the output of said one operational amplifier and the current input to said second operational amplifier, and 5) an output terminal at the output of the operational amplifier which is not connected to said feedback circuits, b) a first resistor connected between said output terminal and said inverting input, and c) a second resistor connected between said current input and a voltage reference, said inverting gain amplifier inverting and amplifying an input voltage signal at said non-inverting input in accordance with the relative resistance values of said first and second resistors.

16. An instrumentation amplifier, comprising:
a) a three-terminal operational amplifier, comprising:
1) an inverting input terminal,
2) a non-inverting input terminal,
3) an output terminal,
4) a circuit urging said inverting and non-inverting terminals toward a common voltage level,
5) a current input terminal for supplying a current input, and
6) circuit means for adding a current which matches said current input and is inverted with respect thereto to the input current supplied by said inverting input terminal, and for urging said current input terminal toward a common voltage level with said inverting and non-inverting input terminals, b) a first resistor connected between said output terminal and said inverting input terminal, c) a second resistor connected between said current input and a voltage reference, d) a two-terminal operational amplifier having an inverting input, a non-inverting input, an output, and a feedback circuit connected between its output and its inverting input, and e) a third resistor connected between the output of said two-terminal operational amplifier and the inverting input of said three-terminal operational amplifier, said instrumentation amplifier producing an output voltage relative to said voltage reference in accordance with the values of respective input voltages applied to the non-inverting inputs of said two-terminal and three-terminal operational amplifiers and the relative resistance values of said first and third resistors.

17. An instrumentation amplifier, comprising:
a) a three-terminal operational amplifier, comprising:
1) a first operational amplifier having inverting and non-inverting inputs and an output, 2) a second operational amplifier having a current input, a second input connected in common with one of the inputs to said first operational amplifier, and an output, 3) a first feedback circuit connected between the output of one of said operational amplifiers and the inverting input of said first operational amplifier, 4) a second feedback circuit connected between the output of said one operational amplifier and the current input to said second operational amplifier, and 5) an output terminal at the output of the operational amplifier which is not connected to said feedback circuits, b) a first resistor connected between said output terminal and said inverting input terminal, c) a second resistor connected between said current input and a voltage reference, d) a two-terminal operational amplifier having an inverting input, a non-inverting input, an output, and a feedback circuit connected between its output and its inverting input, and e) a third resistor connected between the output of said two-terminal operational amplifier and the inverting input of said three-terminal operational amplifier, said instrumentation amplifier producing an output voltage relative to said voltage reference in accordance with the values of respective input voltages applied to the non-inverting inputs of said two-terminal and three-terminal operational amplifiers and the relative resistance values of said first and third resistors.

18. An integrator circuit, comprising:
a) a three-terminal operational amplifier, comprising:
1) an inverting input terminal,
2) a non-inverting input terminal,
3) an output terminal,
4) a circuit urging said inverting and non-inverting terminals toward a common voltage level,
5) a current input terminal for supplying a current input, and
6) circuit means for adding a current which matches said current input and is inverted with respect thereto to the input current supplied by said inverting input terminal, and for urging said current input terminal toward a common voltage level with said inverting and non-inverting input terminals, b) a first capacitor between said output and inverting input terminals, c) a first resistor connected between said inverting input and a voltage reference, and d) a second capacitor connected between said current input and said voltage reference, said integrator circuit integrating an input voltage signal at said non-inverting input in accordance with the values of said first and second capacitors and said first resistor.

19. The integrator circuit of claim 18, wherein said first and second capacitors have substantially equal values of capacitance.

20. An integrator circuit, comprising:
a) a three-terminal operational amplifier, comprising:
1) a first operational amplifier having inverting and non-inverting inputs and an output, 2) a second operational amplifier having a current input, a second input connected in common with one of the inputs to said first operational amplifier, and an output,
3) a first feedback circuit connected between the output of one of said operational amplifiers and the inverting input of said first operational amplifier,
4) a second feedback circuit connected between the output of said one operational amplifier and the current input to said second operational amplifier, and
5) an output terminal at the output of the operational amplifier which is not connected to said feedback circuits,
b) a first capacitor connected between said output and inverting input terminals,
c) a first resistor connected between said inverting input and a voltage reference, and
d) a second capacitor connected between said current input and said voltage reference,
said integrator circuit integrating an input voltage signal at said non-inverting input in accordance with the values of said first and second capacitors and said first resistor.

21. The integrator circuit of claim 20, wherein said first and second capacitors having substantially equal values of capacitance.

22. A differentiator circuit, comprising:
a) a three-terminal operational amplifier, comprising:
1) an inverting input terminal,
2) a non-inverting input terminal,
3) an output terminal,
4) a circuit urging said inverting and non-inverting terminals toward a common voltage level,
5) a current input terminal for supplying a current input, and
6) circuit means for adding a current which matches said current input and is inverted with respect thereto to the input current supplied by said inverting input terminal, and for urging said current input terminal toward a common voltage level with said inverting and non-inverting input terminals,
b) a first resistor connected between said output and inverting input terminals,
c) a first capacitor connected between said inverting input and a voltage reference, and
d) a second resistor connected between said current input and said voltage reference,
said differentiator circuit differentiating an input voltage signal at said non-inverting input in accordance with the values of said first and second resistors and said first capacitor.

23. The differentiator circuit of claim 22, wherein said first and second resistors have substantially equal values of resistance.

24. A differentiator circuit, comprising:
a) a three-terminal operational amplifier, comprising:
1) a first operational amplifier having inverting and non-inverting inputs and an output,
2) a second operational amplifier having a current input, a second input connected in common with one of the inputs to said first operational amplifier, and an output,
3) a first feedback circuit connected between the output of one of said operational amplifiers and the inverting input of said first operational amplifier,
4) a second feedback circuit connected between the output of said one operational amplifier and the current input to said second operational amplifier, and
5) an output terminal at the output of the operational amplifier which is not connected to said feedback circuits,
b) a first resistor connected between said output and inverting input terminals,
c) a first capacitor connected between said inverting input and a voltage reference, and
d) a second resistor connected between said current input and said voltage reference,
said differentiator circuit differentiating an input voltage signal at said non-inverting input in accordance with the values of said first and second resistors and said first capacitor.

25. The differentiator circuit of claim 24, wherein said first and second resistors have substantially equal values of resistance.

26. A three-terminal operational amplifier, comprising:
a composite operational amplifier having inverting, non-inverting and current inputs for receiving respective externally supplied signals, said inverting and non-inverting inputs being connected as inputs in a first two-terminal operational amplifier configuration within said composite operational amplifier, and said current input together with one of said inverting and non-inverting inputs being connected as inputs to a second two-terminal operational amplifier configuration within said composite operational amplifier, said first and second two-terminal operational amplifier configurations having respective outputs, said second two-terminal operational amplifier configuration urging said current input toward a common voltage level with said inverting and non-inverting inputs, the output of said second two-terminal operational amplifier configuration being passively decoupled from said non-inverting input,
a first resistive feedback circuit connected between the output of one of said two-terminal operational amplifier configurations and said inverting input,
a second resistive feedback circuit connected between the output of said one two-terminal operational amplifier configuration and said current input, and
the output of the other of said two-terminal operational amplifier configurations providing an output for said composite operational amplifier which is not connected to said feedback circuits.

27. A summing amplifier, comprising:
a) a three-terminal operational amplifier comprising:
1) a composite operational amplifier having inverting, non-inverting and current inputs, said inverting and non-inverting inputs being connected as inputs in a first two-terminal operational amplifier configuration within said composite operational amplifier, and said current input together with one of said inverting and non-inverting inputs being connected as inputs to a second two-terminal operational amplifier configuration within said composite operational amplifier, said first and second two-terminal operational amplifier configurations having respective outputs,
2) a first feedback circuit connected between the output of one of said two-terminal operational amplifier configurations and said inverting input,
3) a second feedback circuit connected between the output of said one two-terminal operational amplifier configuration and said current input, and
4) the output of the other of said two-terminal operational amplifier configurations providing an output for said composite operational amplifier which is not connected to said feedback circuits,
b) a feedback resistor connected between said composite operational amplifier output and said inverting input,
c) a plurality of summing inputs connected across respective summing input resistors to said inverting input to produce an inverted summed signal at said composite operational amplifier output, and
d) at least one additional summing input connected across respective additional summing input resistors to said current input to produce a non-inverted summed signal which accumulates with said inverted summed signal at said composite operational amplifier output.

28. An inverting gain amplifier, comprising:
a) a three-terminal operational amplifier, comprising:
1) a composite operational amplifier having inverting, non-inverting and current inputs for receiving respective externally supplied signals, said inverting and non-inverting inputs being connected as inputs in a first two-terminal operational amplifier configuration within said composite operational amplifier, and said current input together with one of said inverting and non-inverting inputs being connected as inputs to a second two-terminal operational amplifier configuration within said composite operational amplifier, said first and second two-terminal operational amplifier configurations having respective outputs, said second two-terminal operational amplifier configuration urging said current input toward a common voltage level with said inverting and non-inverting inputs, the output of said second two-terminal operational amplifier configuration being passively decoupled from said non-inverting input,
2) a first resistive feedback circuit connected between the output of one of said two-terminal operation amplifier configurations and said inverting input,
3) a second resistive feedback circuit connected between the output of said one two-terminal operational amplifier configuration and said current input, and
4) the output of the other of said two-terminal operational amplifier configurations providing an output for said composite operational amplifier which is not connected to said feedback circuits,
b) a first resistor connected between said composite operational amplifier output and said inverting input, and
c) a second resistor connected between said current input and a voltage reference,
said inverting gain amplifier inverting and amplifying an input voltage signal at said non-inverting input in accordance with the relative resistance values of said first and second resistors.

29. An instrumentation amplifier, comprising:
a) a three-terminal operational amplifier, comprising:
1) a composite operational amplifier having inverting, non-inverting and current inputs, said inverting and non-inverting inputs being connected as inputs in a first two-terminal operational amplifier configuration within said composite operational amplifier, and said current input together with one of said inverting and non-inverting inputs being connected as inputs to a second two-terminal operational amplifier configuration within said composite operational amplifier, said first and second two-terminal operational amplifier configurations having respective outputs,
2) a first feedback circuit connected between the output of one of said two-terminal operational amplifier configurations and said inverting input,
3) a second feedback circuit connected between the output of said one two-terminal operational amplifier configuration and said current input, and
4) the output of the other of said two-terminal operational amplifier configurations providing an output for said composite operational amplifier which is not connected to said feedback circuits,
b) a first resistor connected between said composite operational amplifier output and said inverting input,
c) a second resistor connected between said current input and a voltage reference,
d) a two-terminal operational amplifier having an inverting input, a non-inverting input, an output, and a feedback circuit connected between its output and its inverting input, and
e) a third resistor connected between the output of said two-terminal operational amplifier and the inverting input of said three-terminal operational amplifier,
said instrumentation amplifier producing an output voltage relative to said voltage reference in accordance with the values of respective input voltages applied to the non-inverting inputs of said two-terminal and three-terminal operational amplifiers and the relative resistance values of said first and third resistors.

30. An integrator circuit, comprising:
a) a three-terminal operational amplifier, comprising:
1) a composite operational amplifier having inverting, non-inverting and current inputs, said inverting and non-inverting inputs being connected as inputs in a first two-terminal operational amplifier configuration within said composite operational amplifier, and said current input together with one of said inverting and non-inverting inputs being connected as inputs to a second two-terminal operational amplifier configuration within said composite operational amplifier, said first and second two-terminal operational amplifier configurations having respective outputs,
2) a first feedback circuit connected between the output of one of said two-terminal operational amplifier configurations and said inverting input, 3) a second feedback circuit connected between the output of said one two-terminal operational amplifier configuration and said current input, and
4) the output of the other of said two-terminal operational amplifier configurations providing an output for said composite operational amplifier which is not connected to said feedback circuits, b) a first capacitor connected between said composite operational amplifier output and said inverting input, c) a first resistor connected between said inverting input and a voltage reference, and d) a second capacitor connected between said current input and said voltage reference, said integrator circuit integrating an input voltage signal at said non-inverting input in accordance with the values of said first and second capacitors and said first resistor.

31. A differentiator circuit, comprising:
a) a three-terminal operational amplifier, comprising:
1) a composite operational amplifier having inverting, non-inverting and current inputs, said inverting and non-inverting inputs being connected as inputs in a first two-terminal operational amplifier configuration within said composite operational amplifier, and said current input together with one of said inverting and non-inverting inputs being connected as inputs to a second two-terminal operational amplifier configuration within said composite operational amplifier, said first and second two-terminal operational amplifier configurations having respective outputs, 2) a first feedback circuit connected between the output of one of said two-terminal operational amplifier configurations and said inverting input, 3) a second feedback circuit connected between the output of said one two-terminal operational amplifier configuration and said current input, and 4) the output of the other of said two-terminal operational amplifier configurations providing an output for said composite operational amplifier which is not connected to said feedback circuits, b) a first resistor connected between said composite operational amplifier output and said inverting input, c) a first capacitor connected between said inverting input and a voltage reference, and d) a second resistor connected between said current input and said voltage reference, said differentiator circuit differentiating an input voltage signal at said non-inverting input in accordance with the values of said first and second resistors and said first capacitor.

* * * * *